Oct. 30, 1951 F. M. MURPHY ET AL 2,573,045

TUNER FOR ULTRA-HIGH RADIO FREQUENCIES

Filed Sept. 14, 1950

2 SHEETS—SHEET 1

INVENTORS:
Frank M. Murphy
and Joseph E. La Marsh,
BY Dawson & Ooms,
ATTORNEYS.

TUNER FOR ULTRA-HIGH RADIO FREQUENCIES

Filed Sept. 14, 1950

2 SHEETS—SHEET 2

INVENTORS:
Frank M. Murphy
and Joseph E. La Marsh,
BY Dawson & Ooms,
ATTORNEYS.

Patented Oct. 30, 1951

2,573,045

UNITED STATES PATENT OFFICE 2,573,045

TUNER FOR ULTRAHIGH RADIO FREQUENCIES

Frank M. Murphy and Joseph E. La Marsh, Chicago, Ill.

Application September 14, 1950, Serial No. 184,732

8 Claims. (Cl. 178—44)

Our invention relates to an improved tuner particularly suitable for use at ultrahigh frequencies such as the proposed 480 mc. to 920 mc. television band.

At ultrahigh frequencies it is not possible to employ conventional variable capacitors or other devices for tuning. However, the circuit elements, such as cavity resonators, transmission lines, and the like which act as resonant circuits at these frequencies are not suitable for use as tuners because of limited range, the necessity of using sliding contacts, or other reasons.

In accordance with the present invention an effective tuner suitable for use at ultrahigh frequencies is provided. The tuner consists of a bed over which a conducting roller rolls in a predetermined path. A pair of conductors are anchored at their opposite ends to the roller and to the bed and are spaced laterally of the direction of motion of the roller, thus defining a transmission line. The length of this transmission line is determined by the position of the roller and may be adjusted at will by rolling the roller along its path. Since the transmission line is effectively short circuited at the roller without the need for current carrying moving contacts, the tuner operates without reliance on such contacts.

Since the conducting roller which determines the length of the tuning transmission line of the tuner of the present invention can accommodate many pairs of transmission line conductors, the tuner is particularly suitable for use in a device, such as a television receiver, where tracked tuning of a plurality of circuits is desired.

It is therefore a general object of the present invention to provide an improved tuner suitable for use at ultrahigh radio frequencies such as the 480 mc. to 920 mc. proposed television band.

Another object of the present invention is to provide an improved tuner suitable for ultrahigh radio frequency use that does not rely on wiping or relatively moving current carrying parts.

Still another object of the present invention is to provide an improved tuner suitable for ultrahigh radio frequency use which embodies features of combination, construction, and arrangement making it suitable for use in a wide variety of applications and capable of being accommodated in spaces having various shapes.

The novel features which we believe to be characteristic of our invention are set forth with particularity in the appended claims. Our invention itself, however, both as to its organization and method of operation, together with further objects and advantages thereof, may best be understood by reference to the following description taken in connection with the accompanying drawings, in which:

Figure 1 is a view in perspective of an illustrative embodiment of the present invention;

Figures 2 and 3 are cross-sectional views through axes 2—2 and 3—3, Figure 1, respectively;

Figure 1:
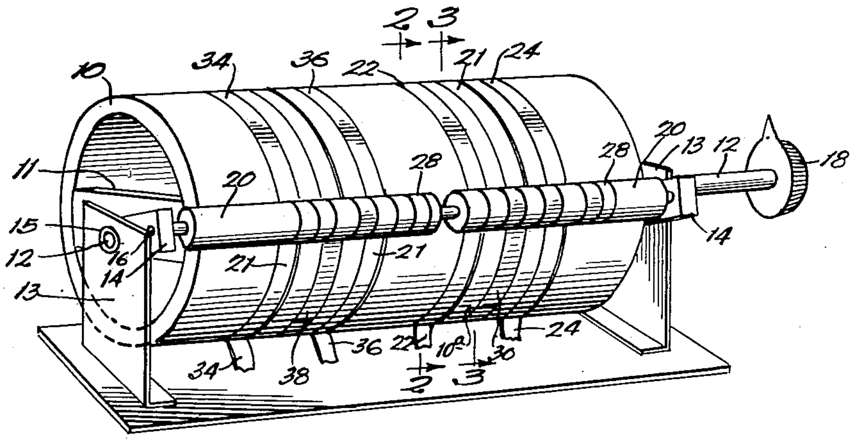

Referring now to the structure of Figure 1, there is shown at 10 a cylinder or sleeve of insulating material such as a phenol-formaldehyde resin. A tuning shaft 12 is rotatably mounted coaxially with the sleeve 10 by cross members 11 and carries a pair of aligned arms 14 on opposite ends of the sleeve. The shaft 12 is supported by brackets 13. A hollow shaft 15, Figures 2 and 3, extends between each member 11 and the associated bracket 13 to hold the member (and sleeve 10) against movement. A shaft 16 extends between these arms as shown and is parallel to and spaced from the surface of sleeve 10 so that as the shaft 12 is rotated by the tuning knob 18 the shaft 12 traverses a circular orbit about the axis of the sleeve and in spaced relation to the surface thereof.

Figure 2:
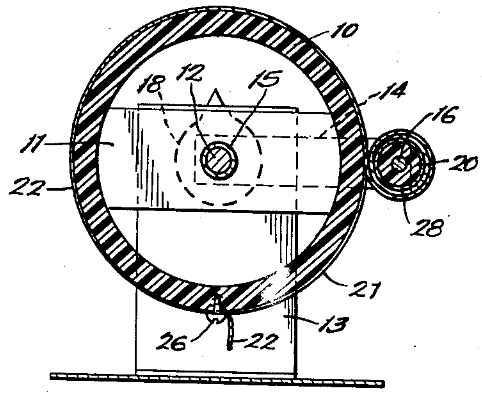
Figure 3:
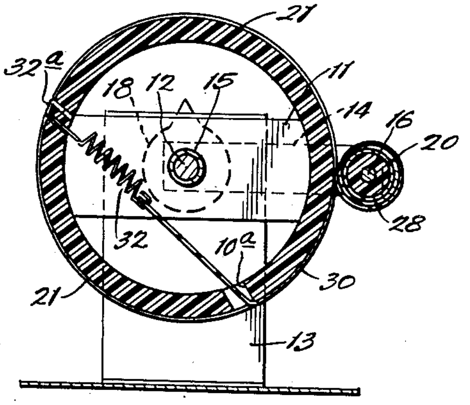

A two-part roller 20 of polystyrene or similar material is received on shaft 16 and is of diameter to extend substantially to the surface of the sleeve 10 as shown in Figures 2 and 3. This roller has a series of outer sleeves 28 of copper or similar material, one corresponding to each circuit to be tuned. In the embodiment of Figure 1, two such sleeves are shown, corresponding to two circuits to be tuned in unison.

The outer surface of sleeve 10 has a series of shallow peripheral grooves 21 as shown. Each of these grooves receives a relatively flexible strap copper conductor which is wound or unwound about the face of the sleeve 10 as the planetary roller 20 traverses its circular orbit about the sleeve.

The conductors 22 and 24 define one tunable transmission line for circuit tuning. They are mounted on the sleeve 10 in like manner and, as shown in Figure 2, are each anchored at one end to the sleeve 10 by the screw 26 or similar device and on the opposite end are wrapped about the conducting sleeve 28 on the planetary roller 20. The ends of the conductors 22 and 24 may be additionally anchored to the planetary roller 20 by a pin or other suitable device (not shown).

The member 30, which fits in the groove of sleeve 10 intermediate conductors 22 and 24, is in a pressure attachment with the sleeve 30 at one end, this attachment being formed by the slot 10*a* through which the member 30 extends, the tension spring 32 which is hooked to the end of the member 30 and anchored to the interior of the sleeve by its end hook 32*a*. At its opposite end the member 30 is wrapped about the planetary roller 20 as shown in Figure 3, the direction of wrapping being opposite to conductors 22 and 24.

It will be noted that the member 30 is wound about the roller 20 in the opposite direction to conductors 22 and 24 and that it extends away from the roller in direction opposite these conductors. Consequently, as the arms 14 are rotated by the shaft 12 to move the roller 20 about its orbit in the clockwise direction as seen in Figure 3, the member 30 is wound up on the roller 20 while the conductors 22 and 24 unwind to an equal degree. The conductors and member 30 are thereby held taut and a measured degree of winding or unwinding achieved. When the shaft is rotated counterclockwise as seen in Figure 3, the opposite effect takes place and the conductors 22 and 24 wind up and the member 30 unwinds.

Preferably the member 30 is of the same material as the conductors 22 and 24. This provides a convenient connection to the neutral or center point of the transmission line defined by the conductors 22 and 24.

The conductors 34 and 36 are constructed and disposed like conductors 22 and 24 to wind up in unison therewith. A member 38, like member 30, is also provided, although this is not essential, as the member 30 alone will maintain the conductors 22, 24, 34, and 36 in a taut condition.

It will be observed that the conductors 22 and 24 define an arcuate parallel conductor transmission line which is short circuited at its end by the conductor 28. The length of this transmission line is adjusted by rotating the shaft 12 to vary the position of the roller 20 which defines the point of short circuit.

It will be further observed that the short circuiting action of the conducting portion 28 of the roller 20 is accomplished by a fixed contact between the inner turns of the conductors 22 and 24 and the portion 28. This positive contact avoids the necessity of relying upon any sliding contact to vary the length of the transmission line for tuning action.

Figure 4:
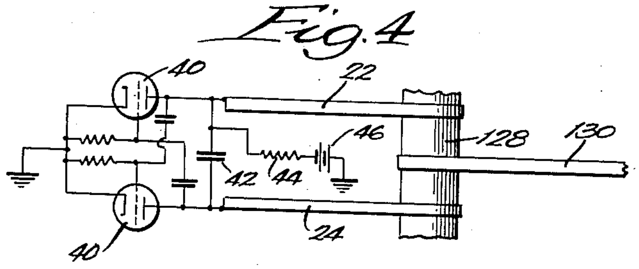
Figure 4 is a schematic circuit diagram of an oscillator tuned by apparatus embodying the present invention and showing the apparatus in developed view.

Figure 4 shows an oscillator circuit embodying the tuner of the present invention. The oscillator uses a pair of triode tubes, which may be the two sections of a type 12AT7 dual triode tube, with their anodes connected to the free ends of the conductors 22 and 24 and their cathodes connected to ground. The control electrodes of the respective triode sections are each connected to ground through 15,000 ohm resistances and to the anode of the other section by a 5 mmf. capacitor. A 15 mmf. shunt capacitor 42 is connected directly between the anodes.

Cathode-anode space path voltage for the tubes is derived from the source 46 which is connected to one anode through the wire wound resistance 44 which acts as a radio frequency choke.

With the oscillator of Figure 4 and using the tuner of Figure 1, a frequency range from 150 ms. to over 280 mc. was tuned without the capacitor 42 and the range from 81 mc. to 220 mc. was tuned with the capacitor. The dimensions of the tuner were:

Sleeve 10, 2⅛″ outside diameter.
Roller 20, ½″ outside diameter.
Conductors 22 and 24, $\frac{3}{16}$″ x .003″ (approx.) copper strap.
Member 30, $\frac{3}{16}$″ x .003″ (approx.) copper strap.
Center-to-center spacing of the conductors 22 and 24, $\frac{3}{16}$″.

The above tuner was constructed for use in the range of 80 to 220 mc. To adapt it for use at higher frequencies, a smaller diameter sleeve 10 may be used. Moreover, if it is desired to decrease the tuning frequency for a particular tuner construction, a high frequency magnetic core material may be used in the sleeve 10 or a dielectric material chosen that decreases the electrical length of the transmission line in relation to its physical length.

Figure 5:
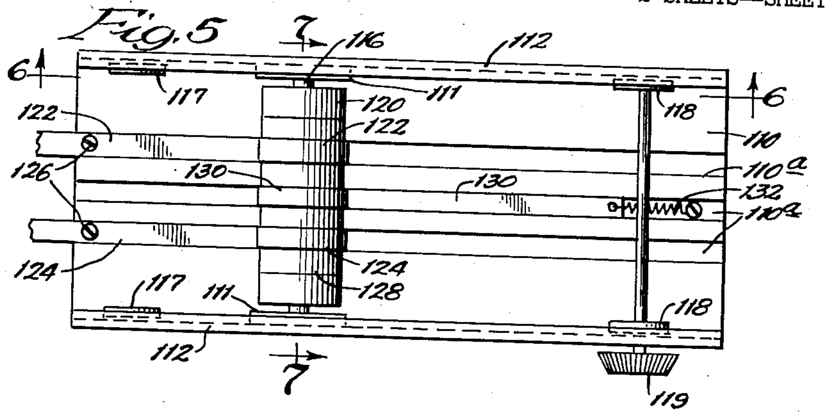
Figure 5 is a top plan view of an alternative form of the present invention.
Figure 6:
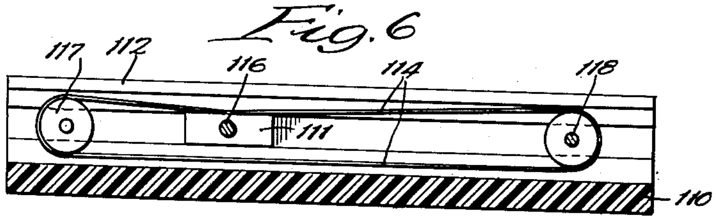
Figure 6 is a cross-sectional view through the axis 6—6, Figure 5.
Figure 7:
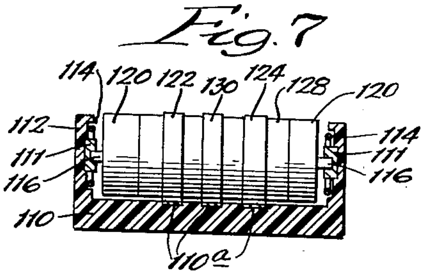
Figure 7 is a cross-sectional view through the axis 7—7, Figure 5.

In the above-described embodiment of the present invention, the tuner employs a planetary roller 20 and a sleeve 10 about which the conductors are wound. In the unit of Figures 5 to 7, a flat bed is used and the conductors are wound or unwound upon it.

Referring now to Figure 5, the bed 110 is a flat block of phenol-formaldehyde resin or similar insulating material. It has a series of parallel shallow longitudinal grooves 110*a* to receive the conductors 122 and 124 and the intermediate tensioning member 130. A roller 120 rides on the shaft 116 to traverse the bed 110.

The spaced conductors 122 and 124 correspond to the conductors 22 and 24, Figure 1, and define a tunable transmission line. Each conductor is anchored to the bed at one end by a screw 126 and at its other end is coiled about the roller 120 and gripped thereby. The intermediate member 130 is constructed like the conductors 122 and 124 and is attached at its free end to the bed 110 by the spring 132. The member 130 is coiled about the roller 120 in the opposite direction to the conductors 122 and 124 so that the roller 120 is pulled in direction to hold conductors 122 and 124 taut.

Conductors 122 and 124, as well as the tensioning member 130, may be flat copper strap or similar material.

The roller 120 is moved along the bed 110 by the riders 111 which fit in the longitudinal slots formed in the side walls 112. Each rider 111 is attached to a cord 114, Figure 6, which is wrapped about a pulley 118, Figure 5, which in turn is attached to the adjusting knob 119. As the knob is rotated, the cords 114 are moved in unison and the riders 111 are shifted in unison along the bed 110. The roller 120 is accordingly bodily moved to wind or unwind the conductors 122 and 124 and unwind or wind the tensioning member 130.

The roller 120 has a conducting sleeve 128 upon which the conductors 122 and 124 and member 130 wind. This sleeve effectively short circuits the coiled ends of the conductors and defines a short circuited transmission line of adjustable length.

Pulleys 117 are idler pulleys to guide the cords 114.

The flexible tensioning members 30 and 130 not only pull their respective rollers 20 and 120 bodily in the direction to tighten the transmission line conductors but, in addition, these members tend to rotate rollers 20 and 120 in the conductor-tightening direction. This assures that the conductors are held in a taut condition at all times.

It will be noted that the sleeve 10 defines a bed over which the planetary roller 20 rolls.

While we have shown structures embodying grooves in which the conductors 22, 24, 30, 34, 36, 38, 122, 124, and 130 fit on the platen or bed, it will of course be understood that these grooves may be omitted if desired.

While we have shown and described specific embodiments of our invention, it will of course be understood that many modifications and alternative constructions may be made without departing from the true spirit and scope thereof. We therefore intend by the appended claims to cover all modifications and alternative constructions falling within the true spirit and scope thereof.

What we claim as new and desire to secure by Letters Patent of the United States is:

1. A tuner for ultrahigh radio frequencies comprising in combination, a bed, a conducting roller adapted to roll over the bed, adjustable means operable to roll the roller over the bed, and a pair of spaced parallel conductors each having one end attached to the bed and the other end attached to the roller to wind or unwind in accord with the position of the roller to define a transmission line of length determined by the position of the roller and short circuited at the roller.

2. A tuner for ultrahigh radio frequencies comprising in combination, a bed member, a conducting roller adapted to roll over the bed, adjustable means operable to move the roller over the bed, a pair of spaced parallel conductors each having one end attached to the bed and the other end attached to the roller to wind or unwind in accord with the position of the roller to define a transmission line of length determined by the position of the roller, and a flexible member having one end attached to the roller and the other end attached to the bed on the side opposite the conductors to maintain the conductors taut as the roller is moved.

3. A tuner for use at ultrahigh radio frequencies comprising in combination a cylindrical bed, a planetary conducting roller adapted to roll on the bed, an adjustable carriage adapted bodily to move the roller about its orbit, a pair of spaced parallel conductors each anchored at one end to longitudinally spaced points on the bed and at the other end to complementary points on the roller to wind or unwind and define an arcuate transmission line of varying length as the carriage is rotated, and a flexible member anchored at one end to the roller and at the other end to the bed at a point spaced from the roller in the opposite direction to the conductors to impart rotations to the roller as it traverses its orbit.

4. A tuner for use at ultrahigh frequencies comprising in combination a cylindrical bed, a planetary conducting roller adapted to roll on the bed, an adjustable carriage adapted to rotate the roller about its orbit, and a pair of spaced parallel conductors anchored at one end to longitudinally spaced points on the bed and at the other end to like points on the roller to wind or unwind as the roller traverses its orbit and thereby define an arcuate transmission line of varying length and short circuited at the roller.

5. A tuner for use at ultrahigh frequencies comprising in combination an insulating cylinder having three spaced circumferential grooves, a conducting planetary roller adapted to roll over the cylinder, a pair of conductors in two of the grooves and each anchored at one end to a groove and at the other end to the roller, and a flexible anchor member in the third groove and affixed at one end to the roller and at the other end to the cylinder and extending from the roller in direction opposite the conductors to impart rotations to the roller as it traverses its orbit.

6. A tuner for use at ultrahigh radio frequencies comprising in combination, a flat bed, a conducting roller, adjustable means to move the roller bodily over the bed, a pair of spaced conductors anchored at one end to the bed and at the other end to the roller to define a transmission line, and a flexible anchoring member attached at one end to the roller and at the other end to the bed and extending from the roller in direction opposite the conductors.

7. A tuner for use at ultrahigh radio frequencies comprising in combination a flat bed, a conducting roller, adjustable means to roll the roller over the bed, and a pair of spaced conductors anchored at one end to the bed and at the other end to the roller to define a transmission line of length varying in accord with the position of the roller.

8. A variable length transmission line particularly suitable for use as a tuner comprising in combination a conducting roller, means to roll the roller over a predetermined path, and a pair of conductors each anchored at one end to the roller and at the other end to a fixed point and spaced laterally of the path to define a transmission line short circuited at the roller.

FRANK M. MURPHY.
JOSEPH E. LA MARSH.

No references cited.